(12) United States Patent
     Adusumilli et al.

(10) Patent No.: US 10,431,503 B2
(45) Date of Patent: Oct. 1, 2019

(54) SACRIFICIAL CAP FOR FORMING SEMICONDUCTOR CONTACT

(71) Applicant: International Business Machines Corporation, Armonk, NY (US)

(72) Inventors: Praneet Adusumilli, Albany, NY (US); Zuoguang Liu, Schenectady, NY (US); Shogo Mochizuki, Clifton Park, NY (US); Jie Yang, Clifton Park, NY (US); Chun W. Yeung, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/816,037

(22) Filed: Nov. 17, 2017

(65) Prior Publication Data
     US 2018/0082909 A1    Mar. 22, 2018

Related U.S. Application Data

(63) Continuation of application No. 15/272,977, filed on Sep. 22, 2016, now Pat. No. 9,805,989.

(51) Int. Cl.
    *H01L 21/8238* (2006.01)
    *H01L 29/417* (2006.01)
    (Continued)

(52) U.S. Cl.
    CPC ........... *H01L 21/823878* (2013.01); *H01L 21/76224* (2013.01); *H01L 21/76895* (2013.01);
    (Continued)

(58) Field of Classification Search
     CPC ....... H01L 21/823878; H01L 21/76895; H01L 21/76224; H01L 29/66553;
     (Continued)

(56) References Cited

U.S. PATENT DOCUMENTS

| 2013/0187228 A1* | 7/2013 | Xie ........................ H01L 29/785 257/347 |
| 2014/0203370 A1* | 7/2014 | Maeda .................. H01L 29/785 257/365 |

(Continued)

OTHER PUBLICATIONS

List of IBM Patents or Patent Applications Treated as Related; (Appendix P), Filed Nov. 17, 2017; 2 pages.

(Continued)

*Primary Examiner* — Kyoung Lee
(74) *Attorney, Agent, or Firm* — Cantor Colburn LLP; Vazken Alexanian

(57) ABSTRACT

A method for forming a semiconductor device includes forming a fins on a substrate, forming a sacrificial gate stack over a channel region of the fins, a source/drain region with a first material on the fins, a first cap layer with a second material over the source/drain region, and a second cap layer with a third material on the first cap layer. A dielectric layer is deposited over the second cap layer. The sacrificial gate stack is removed to expose a channel region of the fins. A gate stack is formed over the channel region of the fins. A portion of the dielectric layer is removed to expose the second cap layer. The second cap layer and the first cap layer are removed to expose the source/drain region. A conductive material is deposited on the source/drain region.

18 Claims, 28 Drawing Sheets

(51) Int. Cl.
*H01L 29/78* (2006.01)
*H01L 29/66* (2006.01)
*H01L 21/762* (2006.01)
*H01L 21/768* (2006.01)
*H01L 23/535* (2006.01)

(52) U.S. Cl.
CPC ............... *H01L 21/823814* (2013.01); *H01L 21/823821* (2013.01); *H01L 23/535* (2013.01); *H01L 29/41791* (2013.01); *H01L 29/66553* (2013.01); *H01L 29/66795* (2013.01); *H01L 29/785* (2013.01); *H01L 2029/7858* (2013.01)

(58) Field of Classification Search
CPC ......... H01L 29/66795; H01L 29/41791; H01L 29/785; H01L 23/535; H01L 21/823821; H01L 2029/7858
See application file for complete search history.

(56) References Cited

U.S. PATENT DOCUMENTS

| | | | | |
|---|---|---|---|---|
| 2015/0318399 A1* | 11/2015 | Jeong | ............... | H01L 29/7853 257/401 |
| 2016/0315146 A1* | 10/2016 | Jung | ............... | H01L 29/0847 |
| 2017/0076973 A1* | 3/2017 | Lee | ............... | H01L 21/764 |

OTHER PUBLICATIONS

Praneet Adusumilli et al., "Sacrificial Cap for Forming Semiconductor Contact", U.S. Appl. No. 15/272,977, filed Sep. 22, 2016.

\* cited by examiner

SACRIFICIAL CAP FOR FORMING SEMICONDUCTOR CONTACT

DOMESTIC PRIORITY

This application is a continuation of U.S. application Ser. No. 15/272,977 filed Sep. 22, 2016, the disclosure of which is incorporated herein by reference in its entirety.

BACKGROUND

The present invention generally relates to complimentary metal-oxide semiconductors (CMOS) and metal-oxide-semiconductor field-effect transistors (MOSFET), and more specifically, to finFET device fabrication.

The MOSFET is a transistor used for switching electronic signals. The finFET is a multiple-gate MOSFET device that mitigates the effects of short channels and reduces drain-induced barrier lowering. The word "fin" refers to a generally fin-shaped semiconductor structure patterned on a substrate that often has three exposed surfaces that form the narrow channel between source and drain regions. A thin dielectric layer arranged over the fin separates the fin channel from the gate. Because the fin provides a three dimensional surface for the channel region, a larger channel length can be achieved in a given region of the substrate as opposed to a planar FET device.

SUMMARY

According to an embodiment of the present invention, a method for forming a semiconductor device includes forming a first fin and a second fin on a substrate, forming a sacrificial gate stack over a channel region of the first fin and a channel region of the second fin, forming a source/drain region with a first material on the first fin and the second fin, forming a first cap layer with a second material over the source/drain region, and forming a second cap layer with a third material on the first cap layer. A dielectric layer is deposited over the second cap layer. The sacrificial gate stack is removed to expose a channel region of the first fin. A gate stack is formed over the channel region of the first fin. A portion of the dielectric layer is removed to expose the second cap layer. The second cap layer and the first cap layer are removed to expose the source/drain region. A conductive material is deposited on the source/drain region.

According to another embodiment of the present invention, a method for forming a semiconductor device includes forming a first fin and a second fin on a substrate, forming a sacrificial gate stack over a channel region of the first fin and a channel region of the second fin, forming a source/drain region with a first material on the first fin and the second fin, wherein forming the source/drain region includes forming a connection between the first fin and the second fin with the first material, forming a first cap layer with a second material over the source/drain region, and forming a second cap layer with a third material on the first cap layer. A dielectric layer is deposed over the second cap layer. The sacrificial gate stack is removed to expose a channel region of the first fin. A gate stack is formed over the channel region of the first fin. A portion of the dielectric layer is removed to expose the second cap layer. The second cap layer and the first cap layer are removed to expose the source/drain region. A conductive material is deposed on the source/drain region.

According to another embodiment of the present invention, a method for forming a semiconductor device includes forming a first fin and a second fin on a substrate, forming a sacrificial gate stack over a channel region of the first fin and a channel region of the second fin, forming a source/drain region with a first material on the first fin and the second fin, forming a first cap layer with a second material over the source/drain region, wherein the first cap layer forms a connection between the source/drain region on the first fin and the source/drain region on the second fin, and forming a second cap layer with a third material on the first cap layer. A dielectric layer is deposited over the second cap layer. The sacrificial gate stack is removed to expose a channel region of the first fin. A gate stack is formed over the channel region of the first fin. A portion of the dielectric layer is removed to expose the second cap layer. The second cap layer and the first cap layer are removed to expose the source/drain region. A conductive material is deposited on the source/drain region.

According to yet another embodiment of the present invention, a conductor device includes a first semiconductor fin and a second semiconductor fin, and a gate stack arranged over a channel region of the first semiconductor fin and the second semiconductor fin. A source/drain region is arranged on the substrate the source/drain region includes a crystalline material having faceted surfaces that contact the first semiconductor fin and the second semiconductor fin. A conductive contact material is arranged in contact with the faceted surfaces of the crystalline material.

BRIEF DESCRIPTION OF THE DRAWINGS

FIGS. 1-17 illustrate an exemplary method for forming a FET device having reduced external resistance.

FIG. 1 illustrates a side view of a wafer that includes a semiconductor layer (substrate) and a sacrificial hardmask arranged on the semiconductor substrate.

FIG. 3 illustrates a cut-away view following the formation of a shallow trench isolation (STI) region adjacent to the fins.

FIG. 6 illustrates a cut-away view following the patterning of a mask over the fins and an etching process that removes exposed portions of the layer of spacer material to expose portions of the fins.

FIG. 7 illustrates a cut-away view following the formation of source/drain region on exposed portions of the fins following the removal of the mask (of FIG. 6).

FIG. 8 illustrates a cut-away view following the formation of a sacrificial cap layer over the source/drain region.

FIG. 9 illustrates a cut-away view following the formation of a liner layer over portions of the sacrificial cap layer.

FIG. 10 illustrates a cut-away view following the formation of a mask over the fins and the removal of the layer of spacer material (of FIG. 9) from the fins.

FIG. 11 illustrates a cut-away view following the formation of source/drain region using a similar epitaxial growth process to form the source/drain region on exposed portions of the fins.

FIG. 12 illustrates a cut-away view following the formation of a liner layer over the sacrificial cap layer.

FIG. 14 illustrates a top view following the removal of the sacrificial gate (of FIG. 13B) and the formation of replacement metal gate stack (gate stack) to form cavities (not shown) that expose the channel regions of the fins.

FIG. 15 illustrates a cut-away view along the line A-A (of FIG. 13B) following the removal of portions of the inter-level dielectric layer to form cavities that expose portions of the source/drain regions over the fins.

FIG. 16 illustrates a cut-away view following the removal of the liner layers and the sacrificial cap layers to expose the source/drain regions.

FIG. 18 illustrates a cut-away view following the formation of source/drain regions.

FIG. 19 illustrates a cut-away view following the formation of a sacrificial cap layer on the source/drain region.

FIG. 20 illustrates a cut-away view of the resultant structure following the removal of the exposed sacrificial cap layers and formation of cavities as described in FIG. 16.

FIG. 21 illustrates a cut-away view following the deposition of a metallic material conformally over exposed portions of the source/drain regions and in the cavities (of FIG. 20).

FIG. 22 illustrates a cut-away view following an annealing process that drives atoms of the metallic material into the source/drain regions and forms silicide regions over the facets of the source/drain regions.

FIG. 23 illustrates a cut-away view following the formation of conductive contacts in the cavities (of FIG. 22) in a similar manner as described above.

DETAILED DESCRIPTION

Figure 1:
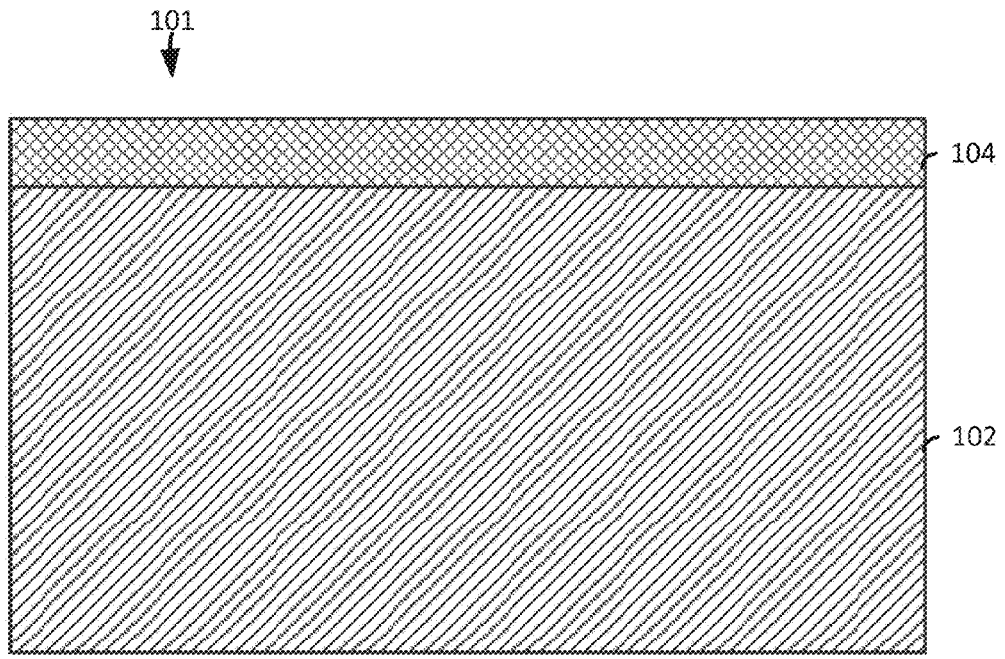

As previously noted herein, the MOSFET is a transistor used for switching electronic signals. The MOSFET has a source, a drain and a gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET has n-doped source and drain junctions and uses electrons as the current carriers. The pFET has p-doped source and drain junctions and uses holes as the current carriers.

The finFET is a type of MOSFET. The finFET is a multiple-gate MOSFET device that mitigates the effects of short channels and reduces drain-induced barrier lowering. The word "fin" refers to a generally fin-shaped semiconductor structure patterned on a substrate that often has three exposed surfaces that form the narrow channel between source and drain regions. A thin dielectric layer arranged over the fin separates the fin channel from the gate. Because the fin provides a three dimensional surface for the channel region, a larger channel length can be achieved in a given region of the substrate as opposed to a planar FET device.

Gate spacers form an insulating film along the gate sidewalls. Gate spacers can also initially be formed along sacrificial gate sidewalls in replacement gate technology. The gate spacers are used to define source/drain regions in active areas of a semiconductor substrate located adjacent to the gate.

The source/drain regions are often formed with a silicide material that is formed on a doped semiconductor material. A liner layer is often arranged on the silicide material, and a conductive contact is formed on the liner layer.

Device scaling in the semiconductor industry reduces costs, decreases power consumption and provides faster devices with increased functions per unit area. Improvements in optical lithography have played a major role in device scaling. However, optical lithography has limitations for minimum dimensions and pitch, which are determined by the wavelength of the irradiation.

In finFET devices, a conductive contact is formed over the source/drain regions to connect the finFET device to a circuit. The conductive contact is often formed by forming a silicide material on the source/drain regions and depositing a conductive material on the silicide material to form a conductive contact. A liner layer can be formed over the silicide prior to depositing the conductive material.

The interface between the conductive contact and the source/drain region can cause undesirable external resistance (parasitic resistance) in the finFET device. One cause of external resistance is the surface area of the interface between the source/drain region and the conductive contact. As the source/drain regions become relatively smaller, the surface area of the interface between the source/drain regions and the contacts becomes smaller, which increases external resistance.

The external resistance can be reduced by, for example, increasing the surface area of the source/drain regions at the interface between the source/drain regions and the conductive contacts. This can be accomplished, by for example, forming a source/drain region and silicide layer that has an undulating or non-planar surface that provides increase surface area at the interface.

However, due to the topography of the crystalline source/drain regions, removing sacrificial liner layers such as SiN liner layers uniformly across the source/drain regions is challenging. If liner layers are not removed sufficiently from the source/drain regions prior to forming a silicide, the effective surface area of the interface between the source/drain regions and the contacts is reduced, which increases the external resistance.

The illustrated exemplary methods and embodiments described herein provide for the formation of a sacrificial layer over the source/drain regions of a FET device that allows the removal of liner layers without damaging the source/drain regions or reducing the surface area of the interface between the source/drain regions and the contacts.

FIGS. 1-17B illustrate an exemplary method for forming a FET device having reduced external resistance.

FIG. 1 illustrates a side view of a wafer 101 that includes a semiconductor layer (substrate) 102 and a sacrificial hardmask 104 arranged on the semiconductor substrate 102.

Non-limiting examples of suitable materials for the semiconductor layer 102 include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb).

A hardmask layer 104 is arranged on the semiconductor substrate 102. The hardmask 104 can include, for example, silicon oxide, silicon nitride (SiN), SiOCN, SiBCN or any suitable combination of those. The hardmask 104 can be deposited using a deposition process, including, but not limited to, PVD, CVD, PECVD, or any combination thereof.

Though the illustrated embodiments show a bulk semiconductor substrate 102, alternative exemplary embodiments can include a semiconductor on insulator wafer arrangement.

Figure 2A:
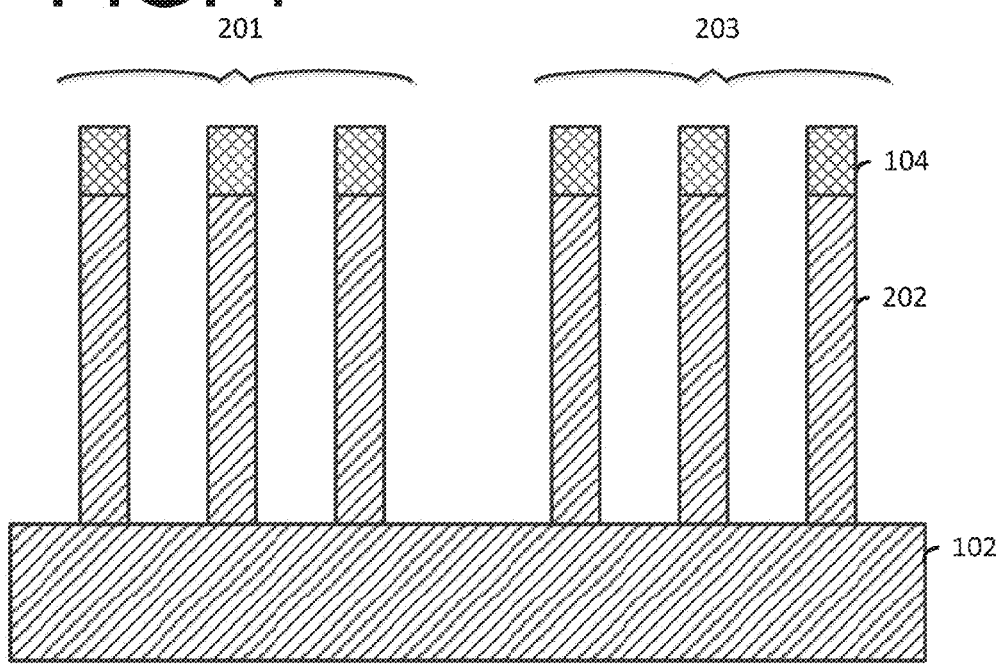
FIG. 2A illustrates a cut-away view along the line A-A (of FIG. 2B) following a lithographic patterning and etching process that forms semiconductor fins.

FIG. 2A illustrates a cut-away view along the line A-A (of FIG. 2B) following a lithographic patterning and etching process that forms semiconductor fins 202. The fins 202 are formed by, for example, a photolithographic patterning and etching process such as reactive ion etching process that patterns a resist on the hardmask 104 and removes exposed portions of the hardmask 104 and the substrate 102 to form the fins 202. In the illustrated exemplary embodiment the fins 201 will form a pFET device and the fins 203 will form an nFET device.

Figure 2B:
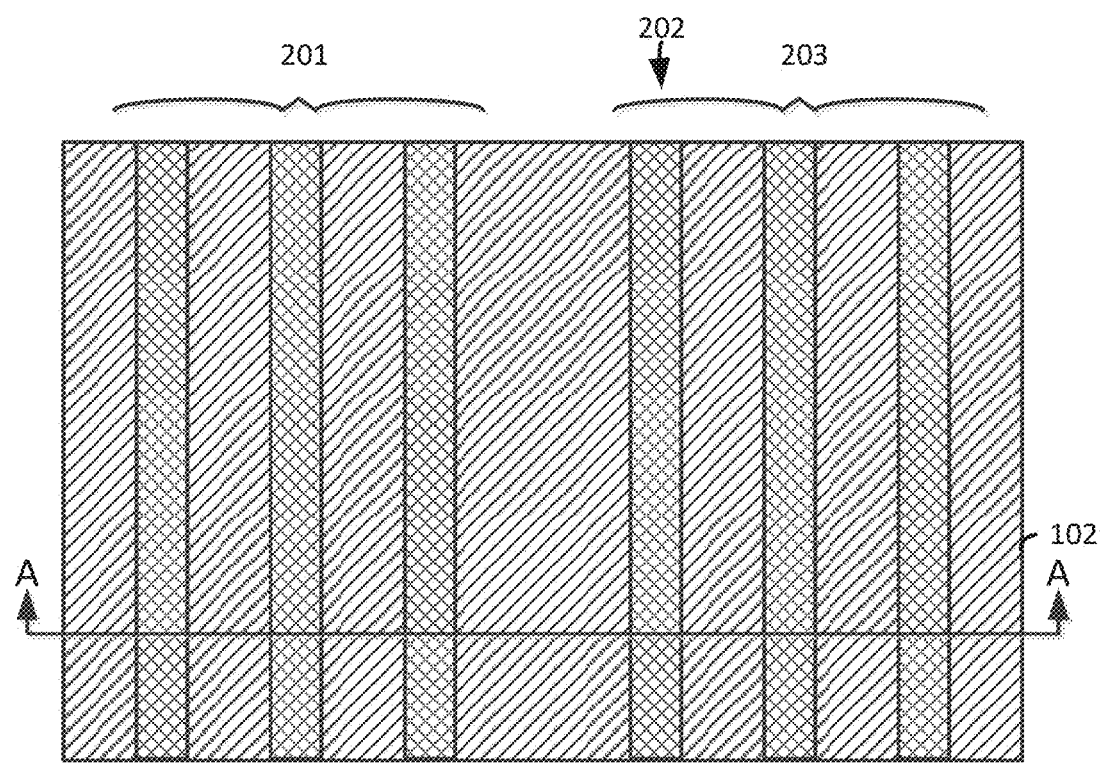
FIG. 2B illustrates a top view of the fins arranged on the substrate.

FIG. 2B illustrates a top view of the fins 202 arranged on the substrate 102.

Figure 3:
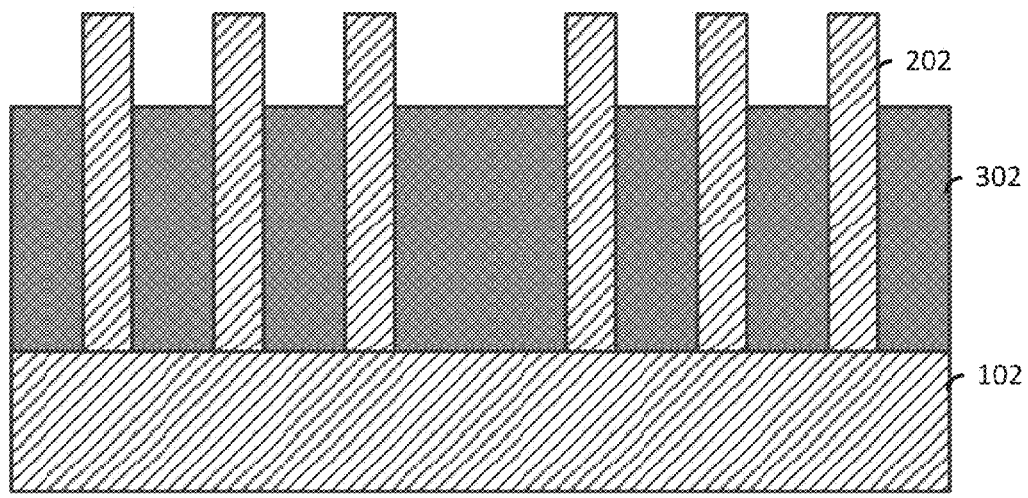

FIG. 3 illustrates a cut-away view following the formation of a shallow trench isolation (STI) region 302 adjacent to the fins 202. The STI region 302 can be formed by, any suitable process including, for example, lithography or etching to form trenches, and then filling the trenches with an insulating material, such as silicon dioxide.

In the illustrated embodiment, at least one isolation region is a shallow trench isolation region ("STI"). However, the isolation region 302 can be a trench isolation region, a field oxide isolation region (not shown), or any other type of isolation region. The isolation region 302 provides isolation between neighboring gate structure regions, and can be used when the neighboring gates have opposite conductivities, e.g., nFETs and pFETs. As such, the isolation region 302 separates an nFET device region from a pFET device region.

Figure 4A:
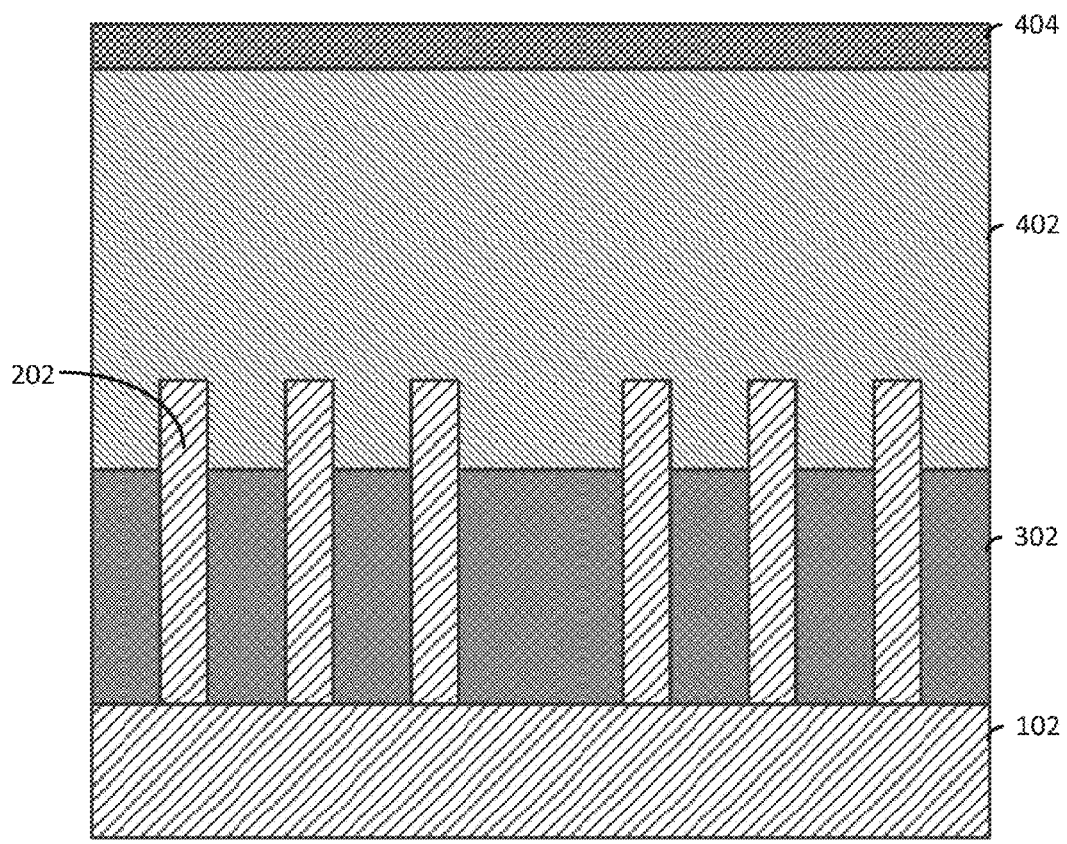
FIG. 4A illustrates a cut-away view along the line A-A (of FIG. 4B) following the formation of sacrificial gate over channel regions of the fins.

FIG. 4A illustrates a cut-away view along the line A-A (of FIG. 4B) following the formation of sacrificial gate 402 over channel regions of the fins 202.

The sacrificial gate 402 in the exemplary embodiment are formed by depositing a layer (not shown) of sacrificial gate material such as, for example, amorphous silicon (aSi), or polycrystalline silicon (polysilicon) material or another suitable sacrificial gate material. The sacrificial gate 402 can further comprise a sacrificial gate dielectric material such as silicon oxide between the nanowires and aSi or polysilicon material.

The layer sacrificial gate material can be deposited by a deposition process, including, but not limited to, physical vapor deposition (PVD), chemical vapor deposition (CVD), atomic layer deposition (ALD, plasma enhanced chemical vapor deposition (PECVD), inductively coupled plasma chemical vapor deposition (ICP CVD), or any combination thereof.

Following the deposition of the layer of sacrificial gate material, a hard mask layer (not shown) such as, for example, silicon oxide, silicon nitride (SiN), SiOCN, SiBCN or any suitable combination of those materials, is deposited on the layer of sacrificial gate material to form a PC hard mask or sacrificial gate cap 404. The hardmask layer can be deposited using a deposition process, including, but not limited to, PVD, CVD, PECVD, or any combination thereof.

Figure 4B:
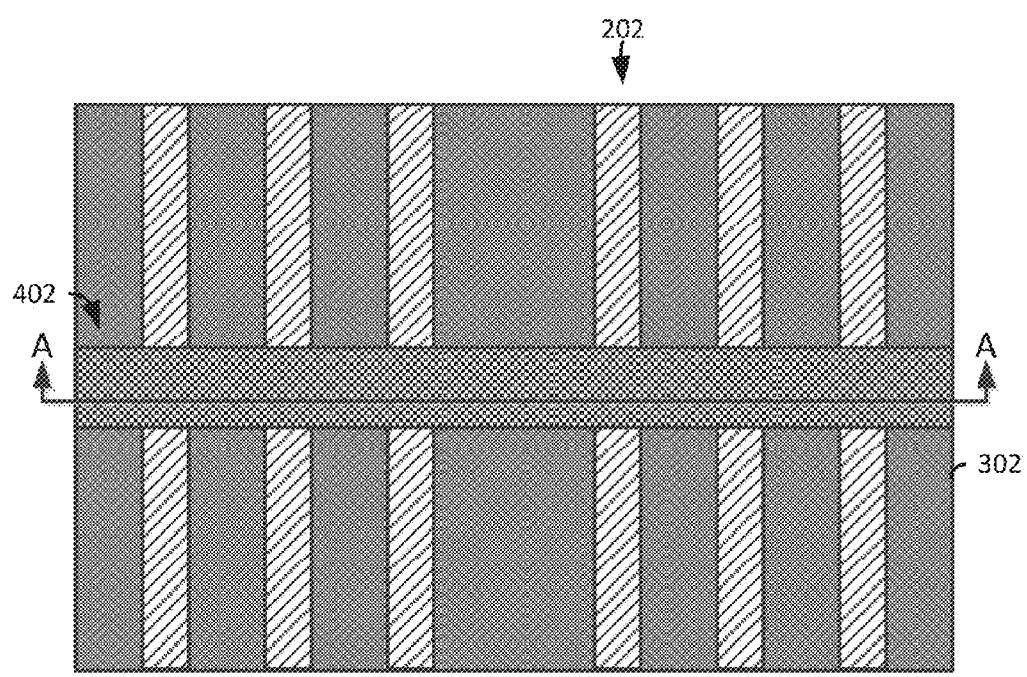
FIG. 4B illustrates a top view of the sacrificial gate.

Following the deposition of the layer sacrificial gate material and the hardmask layer, a lithographic patterning and etching process such as, for example, reactive ion etching or a wet etching process is performed to remove exposed portions of the hardmask layer and the layer of sacrificial gate material form the sacrificial gate 402 and the sacrificial gate cap 404. FIG. 4B illustrates a top view of the sacrificial gate 402.

Figure 5A:
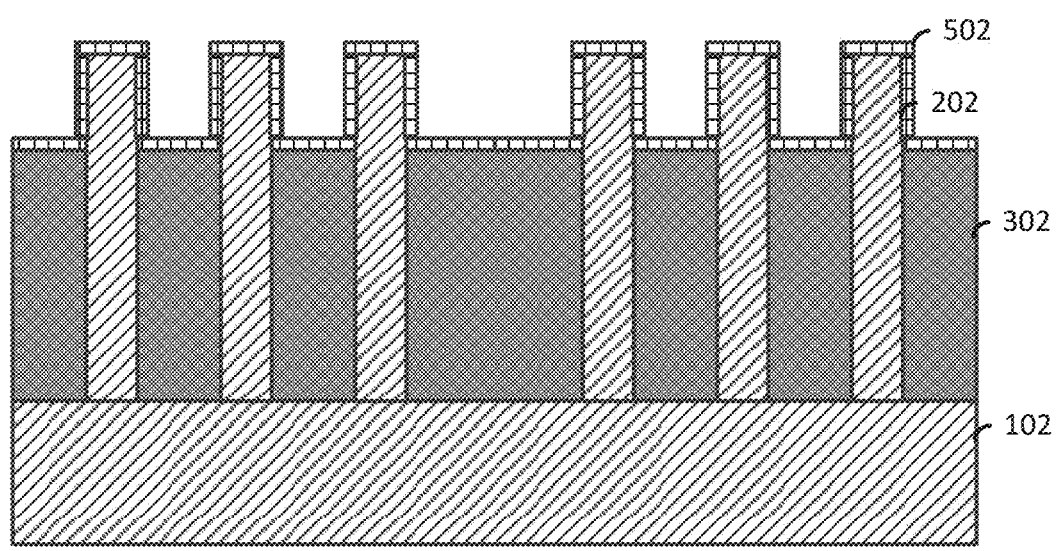
FIG. 5A illustrates a cut-away view along the line A-A (of FIG. 5B) following the deposition of a layer of spacer material over exposed portions of the fins, the STI and the sacrificial gate.

FIG. 5A illustrates a cut-away view along the line A-A (of FIG. 5B) following the deposition of a layer of spacer material 502 over exposed portions of the fins 202, the STI 302 and the sacrificial gate 402.

Non-limiting examples of suitable materials for the layer of spacer material include dielectric nitrides (e.g., silicon nitride), dielectric oxynitrides, SiBCN, SiOCN, SiOC, dielectric oxides (e.g., silicon oxide), or any combination thereof. The layer of spacer material is deposited by a suitable deposition process, for example, chemical vapor deposition (CVD) or atomic layer deposition (ALD).

Figure 5B:
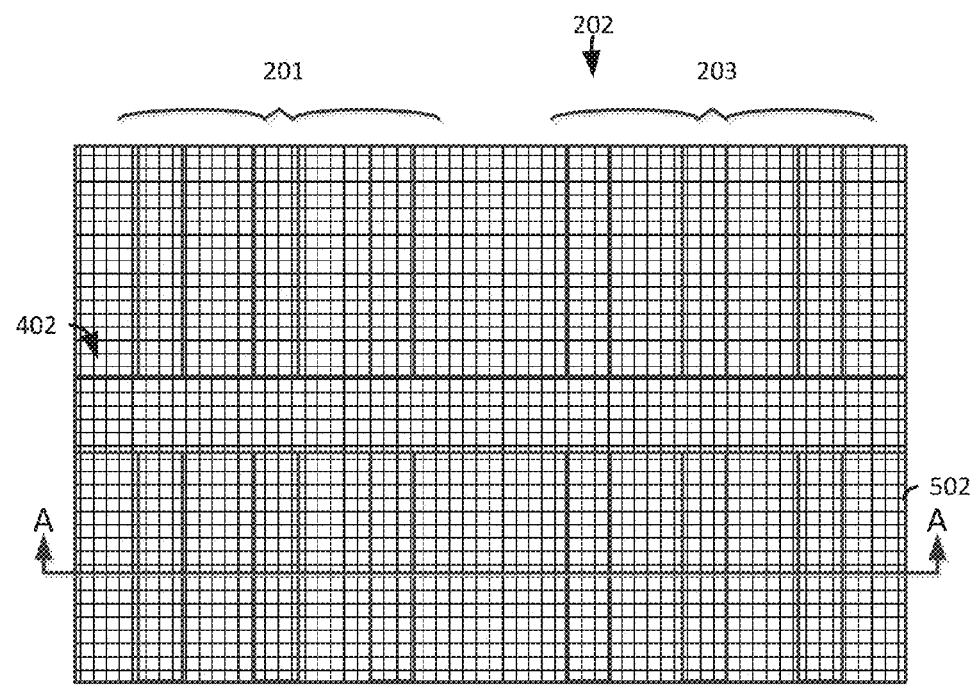
FIG. 5B illustrates a top view following the deposition of the layer of spacer material.
Figure 13A:
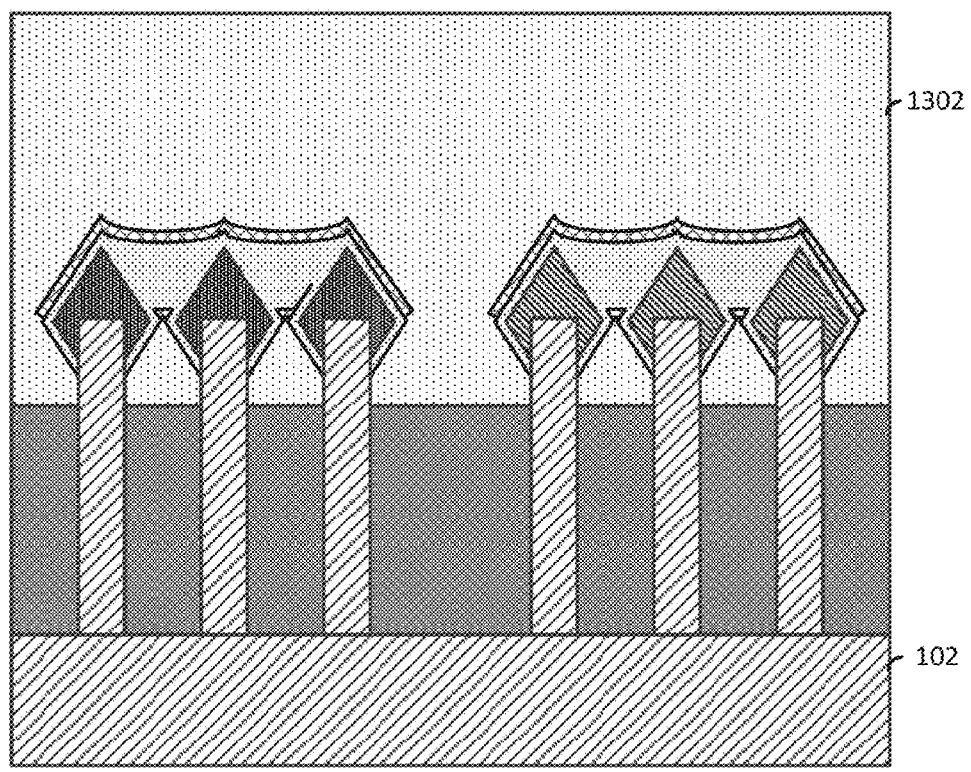
FIG. 13A illustrates a cut-away view along the line A-A (of FIG. 13B) following the formation of an inter-level dielectric layer over the fins.
Figure 13B:
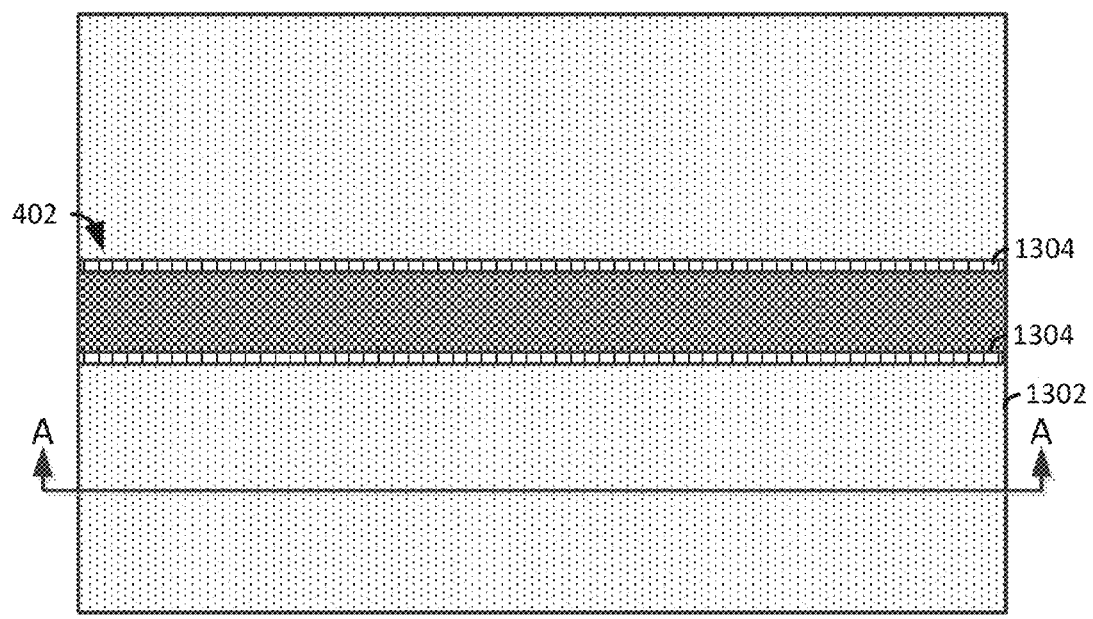
FIG. 13B illustrates a top view of the inter-level dielectric layer and the spacers arranged adjacent to the sacrificial gate.

Following the deposition of the layer of spacer material, a suitable anisotropic etching process such as, for example, a reactive ion etching process is performed to remove portions of the layer of spacer material and form the spacers 1304 (shown in FIG. 13B). FIG. 5B illustrates a top view following the deposition of the layer of spacer material 502.

Figure 6:
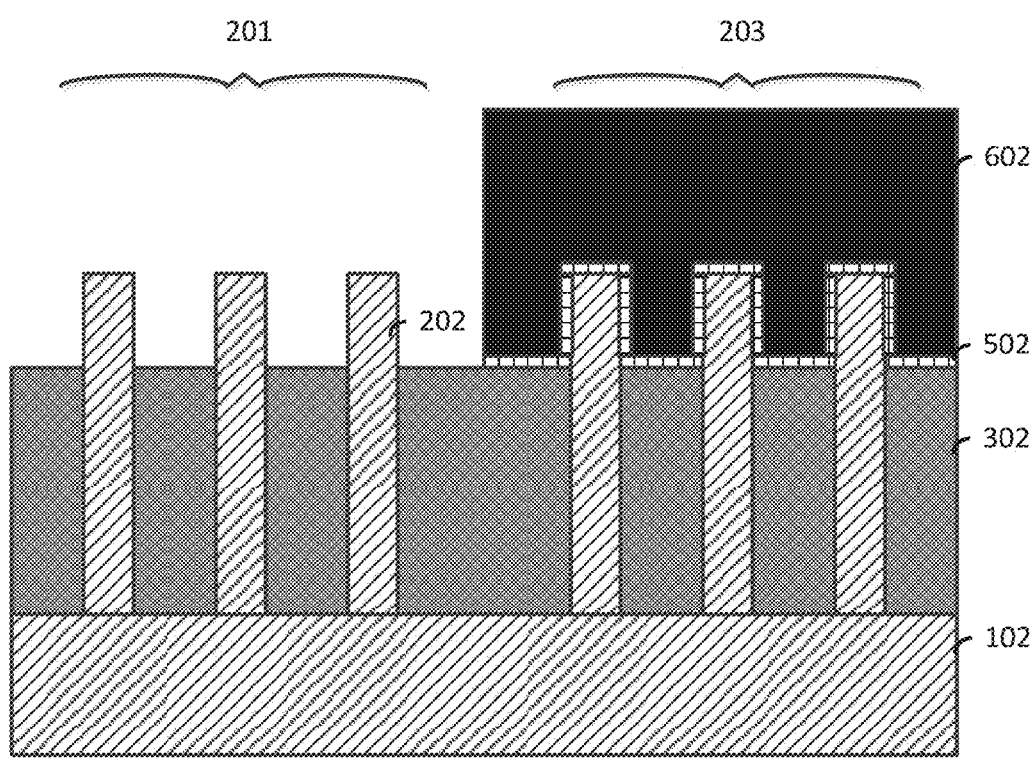

FIG. 6 illustrates a cut-away view following the patterning of a mask 602 over the fins 203 and an etching process that removes exposed portions of the layer of spacer material 502 to expose portions of the fins 201. The layer of spacer material 502 can be removed by, for example, a reactive ion etching process.

Figure 7:
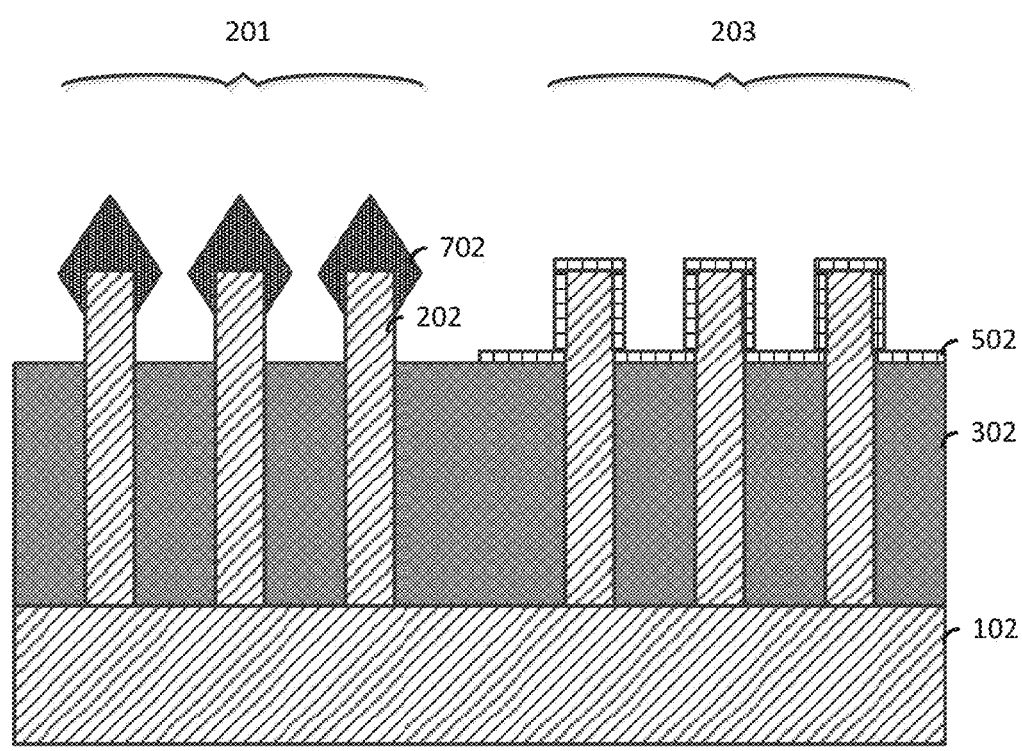

FIG. 7 illustrates a cut-away view following the formation of source/drain region 702 on exposed portions of the fins 201 following the removal of the mask 602 (of FIG. 6)

The source/drain regions 702 are formed by an epitaxial growth process that deposits a crystalline overlayer of semiconductor material onto the exposed crystalline seed material of the exposed fin 202 to form the source/drain regions 702.

Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from 1×1019 cm-3 to 2×1021 cm-3, or preferably between 2×1020 cm-3 to 1×1021 cm-3.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

The mask 602 (of FIG. 6) can be removed by, for example, an ashing process. The ashing process can be used to remove a photoresist material, amorphous carbon, or organic planarization (OPL) layer. Ashing is performed using a suitable reaction gas, for example, O2, N2, H2/N2, O3, CF4, or any combination thereof.

Figure 8:
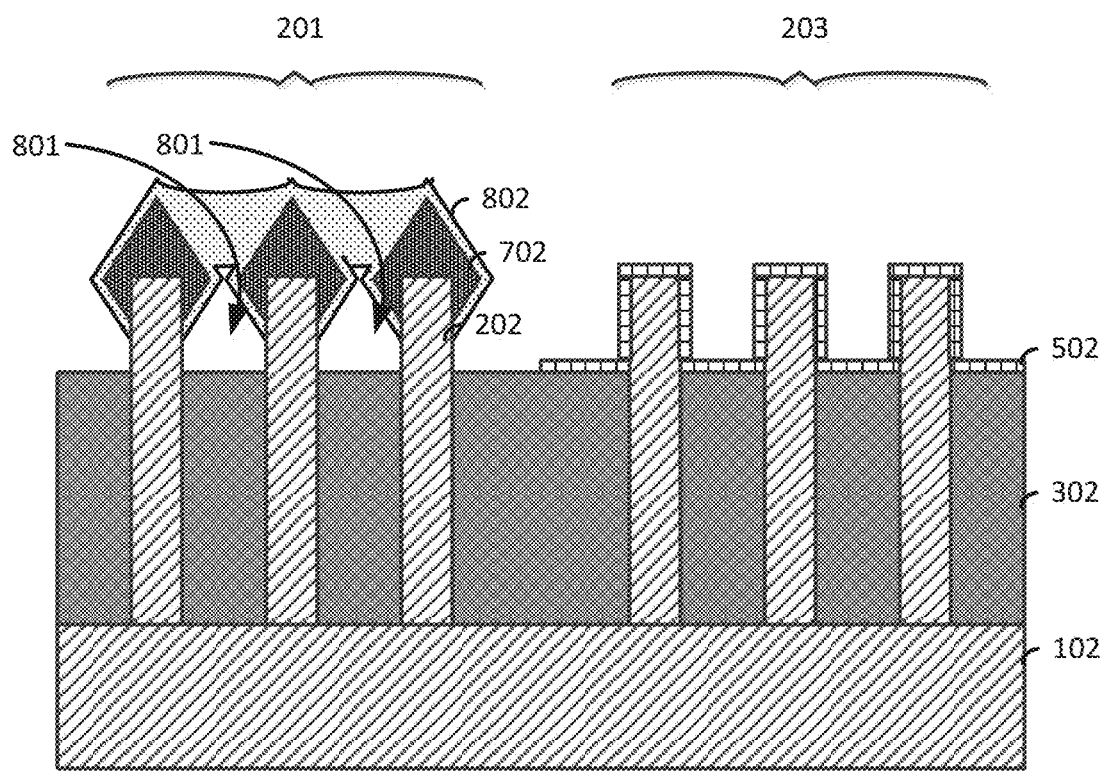

FIG. 8 illustrates a cut-away view following the formation of a sacrificial cap layer 802 over the source/drain region 702. In the illustrated exemplary embodiment, the sacrificial cap layer 802 includes an undoped germanium material that can be formed by, for example, an epitaxial growth process. The sacrificial cap layer 802 is formed from a material that is dissimilar from the source/drain region 702 such that in subsequent etching processes, the sacrificial cap layer 802 can be removed using a selective etching process that does not substantially remove or damage the underlying source/drain region 702.

In the illustrated exemplary embodiment, the formation of the sacrificial cap layer 802 results in the formation of cavities (voids) 801 that are defined by the STI 302, the fins 202 and the sacrificial cap layer 802.

Figure 9:
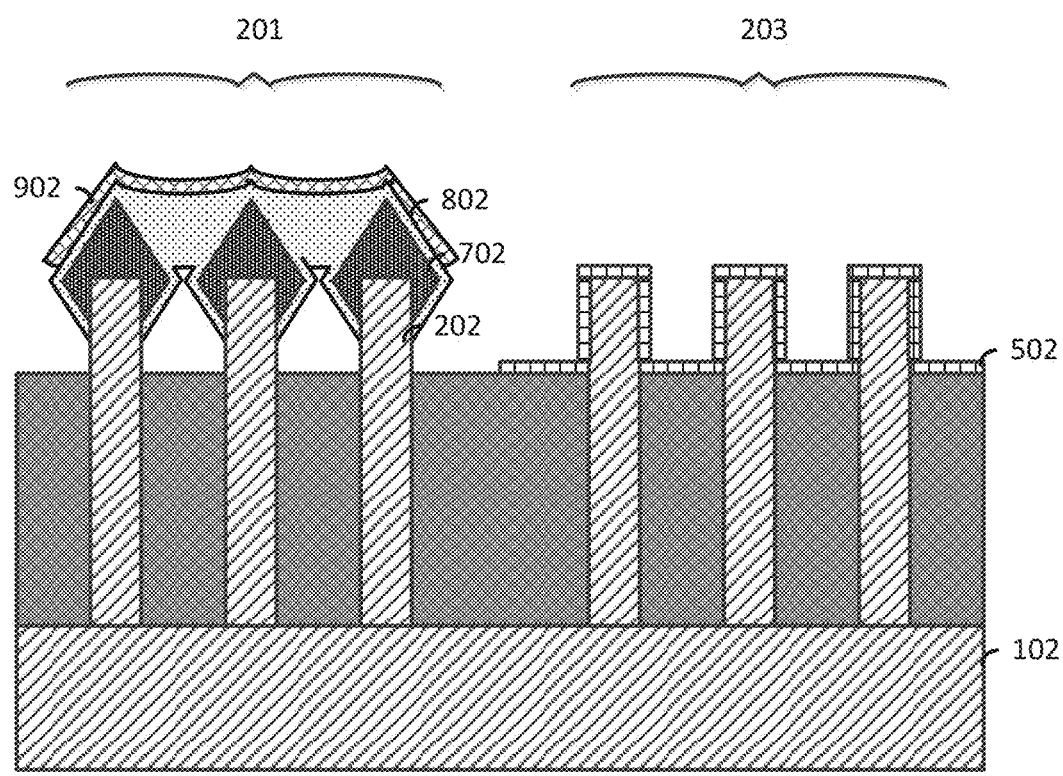

FIG. 9 illustrates a cut-away view following the formation of a liner layer 902 over portions of the sacrificial cap layer 802. The liner layer 902 can include, for example, a nitride material or an oxide material.

Non-limiting examples of oxides include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof.

Figure 10:
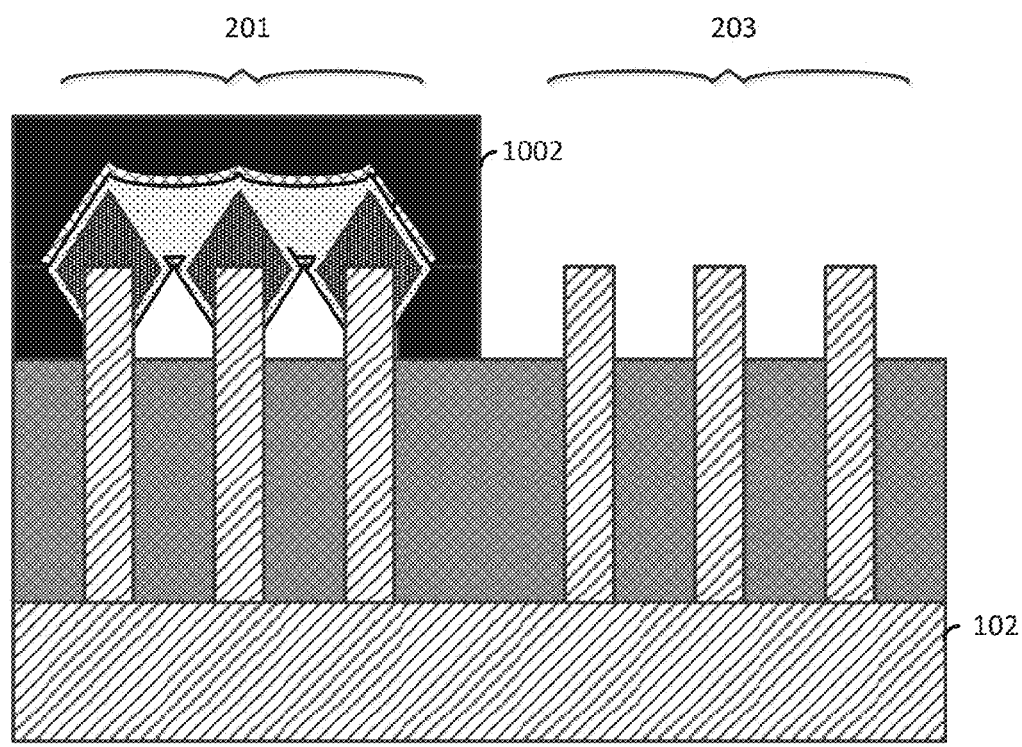

FIG. 10 illustrates a cut-away view following the formation of a mask 1002 over the fins 201 and the removal of the layer of spacer material 502 (of FIG. 9) from the fins 203. The layer of spacer material 502 can be removed by, for example, a reactive ion etching process.

Figure 11:
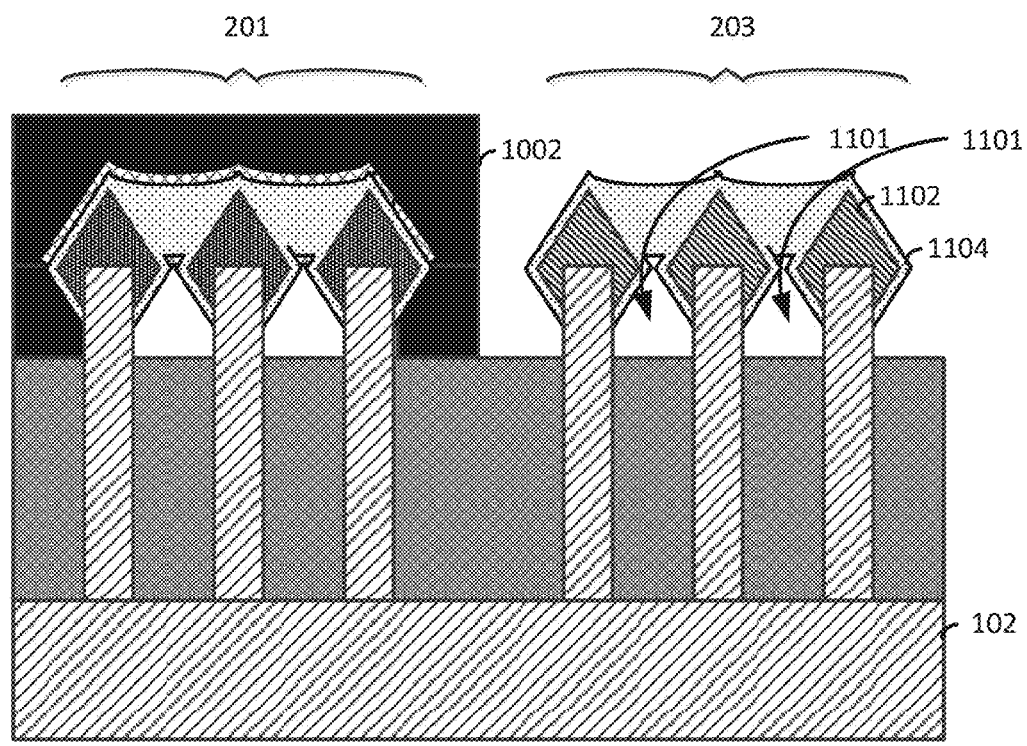

FIG. 11 illustrates a cut-away view following the formation of source/drain region 1102 using a similar epitaxial growth process to form the source/drain region 1102 on exposed portions of the fins 203. Following the formation of the source/drain region 1102, a sacrificial cap layer 1104 is formed on the source/drain region 1102 using a similar epitaxial growth process as described above to form a sacrificial layer of crystalline semiconductor material such as, for example, a germanium material.

Figure 12:
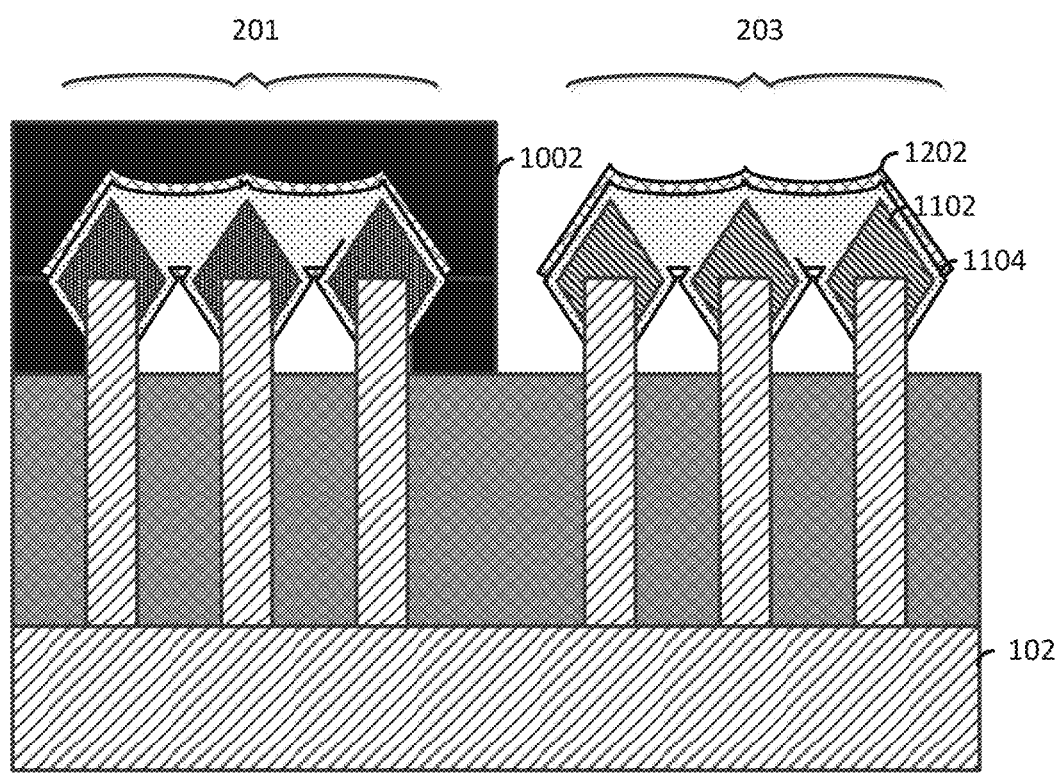

FIG. 12 illustrates a cut-away view following the formation of a liner layer 1202 over the sacrificial cap layer 1104. The liner layer 1202 is similar to the liner layer 902 described above.

FIG. 13A illustrates a cut-away view along the line A-A (of FIG. 13B) following the formation of an inter-level dielectric layer 1302 over the fins 201 and 203.

The inter-level dielectric layer 1302 is formed from, for example, a low-k dielectric material (with k<4.0), including but not limited to, silicon oxide, spin-on-glass, a flowable oxide, a high density plasma oxide, borophosphosilicate glass (BPSG), or any combination thereof. The inter-level dielectric layer 1302 is deposited by a deposition process, including, but not limited to CVD, PVD, plasma enhanced CVD, atomic layer deposition (ALD), evaporation, chemical solution deposition, or like processes. Following the deposition of the inter-level dielectric layer 1302, a planarization process such as, for example, chemical mechanical polishing is performed.

FIG. 13B illustrates a top view of the inter-level dielectric layer 1302 and the spacers 1304 arranged adjacent to the sacrificial gate 402.

Figure 14:
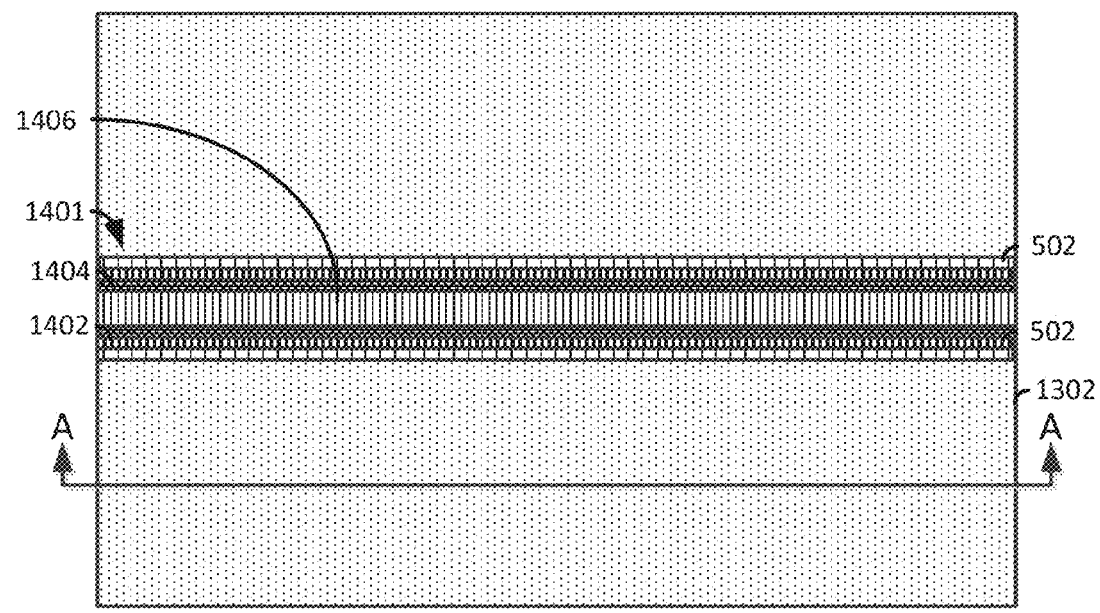

FIG. 14 illustrates a top view following the removal of the sacrificial gate 402 (of FIG. 13B) and the formation of replacement metal gate stack (gate stack) 1401 to form cavities (not shown) that expose the channel regions of the fins 202. The sacrificial gates 402 can be removed by performing a dry etch process, for example, ME, followed by a wet etch process. The wet etch process is selective to (will not substantially etch) the spacers 1304 and the inter-level dielectric material. The chemical etch process can include, but is not limited to, hot ammonia or tetramethylammonium hydroxide (TMAH).

The gate stack 1401 include high-k metal gates formed, for example, by filling the cavity (not shown) with one or more gate dielectric 1402 materials, one or more work function metals 1404, and one or more metal gate conductor 1406 materials. The gate dielectric 1402 material(s) can be a dielectric material having a dielectric constant greater than 3.9, 7.0, or 10.0. Non-limiting examples of suitable materials for the dielectric 1402 materials include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as, for example, lanthanum and aluminum.

The gate dielectric 1402 materials can be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material can vary depending on the deposition process as well as the composition and number of high-k dielectric materials used. The dielectric material layer can have a thickness in a range from about 0.5 to about 20 nm.

The work function metal(s) 1404 can be disposed over the gate dielectric 1402 material. The type of work function metal(s) 1404 depends on the type of transistor and can differ between the nFET and pFET devices. Non-limiting examples of suitable work function metals 1404 include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) can be deposited by a suitable deposition process, for example, CVD, PECVD, PVD, plating, thermal or e-beam evaporation, and sputtering.

The gate conductor 1406 material(s) is deposited over the gate dielectric 1402 materials and work function metal(s) 1404 to form the gate stack 1401. Non-limiting examples of suitable conductive metals include aluminum (Al), platinum (Pt), gold (Au), tungsten (W), titanium (Ti), or any combination thereof. The gate conductor 1406 material(s) can be deposited by a suitable deposition process, for example, CVD, PECVD, PVD, plating, thermal or e-beam evaporation, and sputtering.

Following the deposition of the gate dielectric 1402 materials, the work function metal(s) 1404, and the gate conductor 1406 material(s), planarization process, for example, chemical mechanical planarization (CMP), is performed to remove the overburden of the deposited gate materials and form the gate stack 1401.

Figure 15:
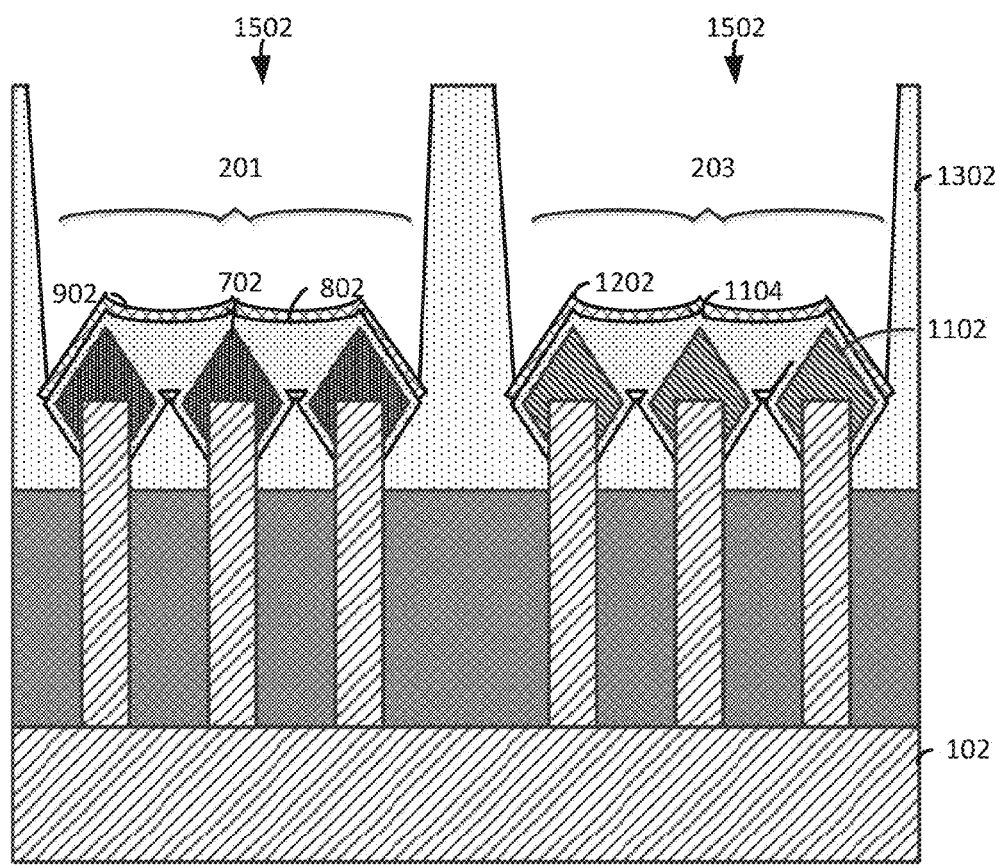

FIG. 15 illustrates a cut-away view along the line A-A (of FIG. 13B) following the removal of portions of the inter-level dielectric layer 1302 to form cavities 1502 that expose portions of the source/drain regions over the fins 201 and 203. The cavities 1502 can be formed by, for example, a photolithographic patterning and etching process such as reactive ion etching.

Figure 16:
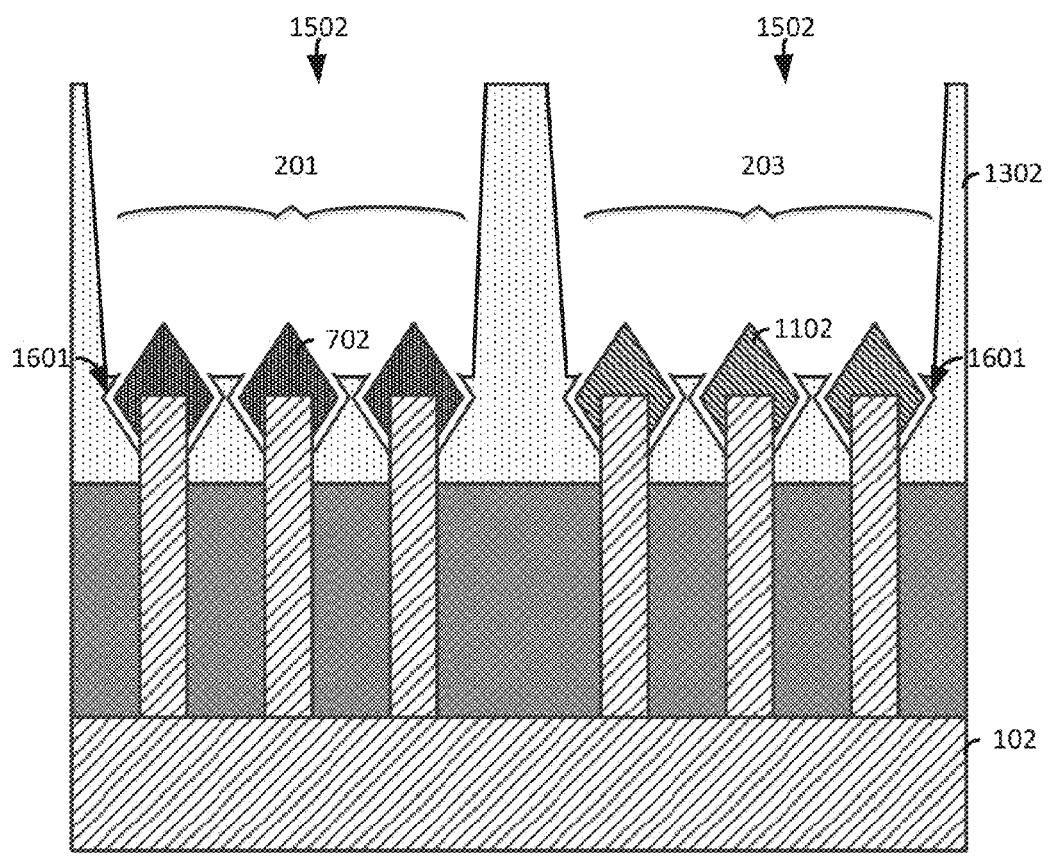

FIG. 16 illustrates a cut-away view following the removal of the liner layers 1202 and 902 and the sacrificial cap layers 1104 and 702 (of FIG. 15) to expose the source/drain regions 702 and 1102. A suitable selective etching process can be used to remove the liner layers 1202 and 902 and the sacrificial cap layers 1104 and 702, which can include isotropic, anisotropic, or a combination of etching processes. In the illustrated exemplary embodiment, the sacrificial cap layers 1104 and 702 are removed using an isotropic wet chemical etching process that selectively removes the exposed sacrificial cap layers 1104 and 702 and forms cavities 1602 in the inter-level dielectric layer 1302.

Figure 17A:
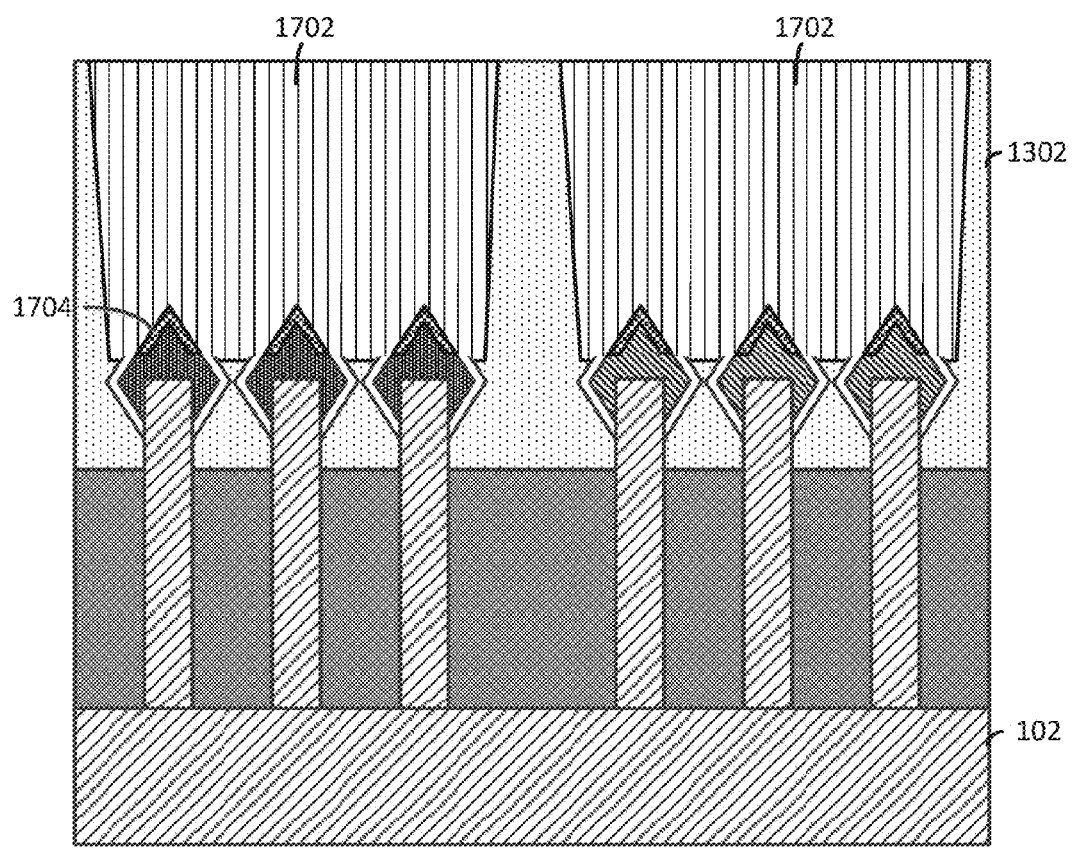
FIG. 17A illustrates a cut-away view along the line A-A (of FIG. 17B) following the deposition of a conductive material in the cavities (of FIG. 16) to form conductive contacts.
Figure 17B:
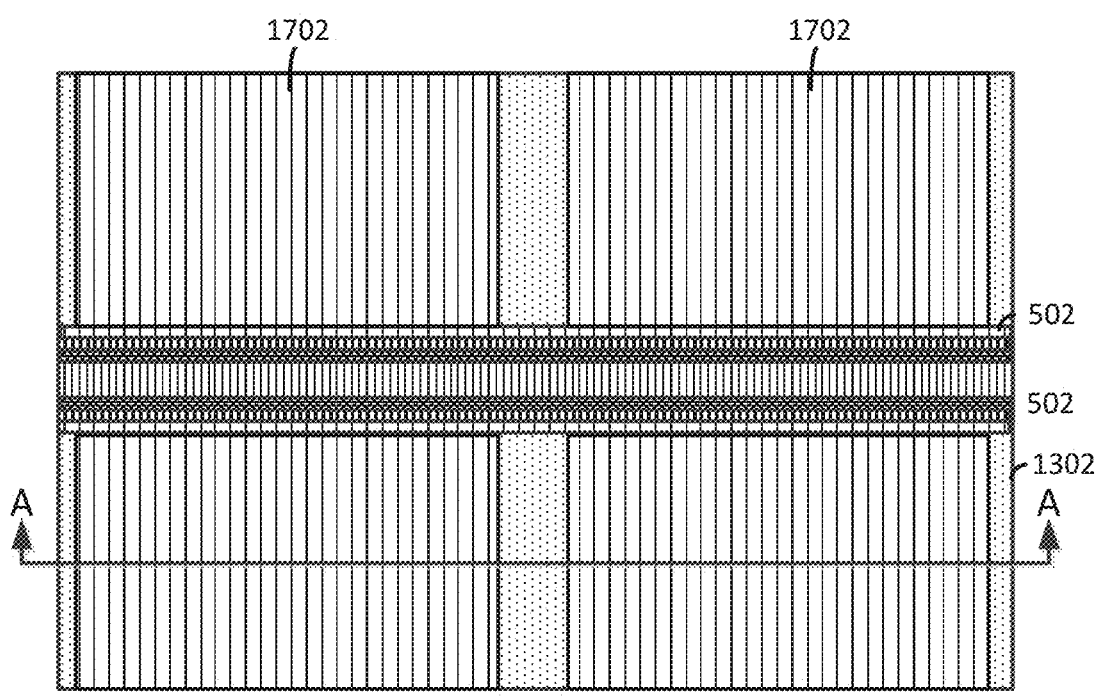
FIG. 17B illustrates a top view following the formation of the conductive contacts.

FIG. 17A illustrates a cut-away view along the line A-A (of FIG. 17B) following the deposition of a conductive material in the cavities 1502 (of FIG. 16) to form conductive contacts 1702. The conductive contacts 1702 can be formed by, for example, depositing a layer of conductive material in the cavities 1502 and performing a planarization process such as chemical mechanical polishing to form the conductive contacts 1702. FIG. 17B illustrates a top view following the formation of the conductive contacts 1702.

The conductive material can include any suitable conductive material including, for example, polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further comprise dopants that are incorporated during or after deposition.

In some exemplary embodiments, silicide regions 1704 can be formed on the source/drain regions 702 and 1102. The silicide can be formed by, for example, depositing a metallic material (not shown) on the exposed portions of the source/drain regions 702 and 1102, and performing an annealing process that forms the silicide regions 1704. In the illustrated exemplary embodiment, the metallic material includes Ti however, other suitable metal materials may be used. The metallic material is deposited using, for example, a physical vapor deposition process that forms the metallic material in a line of sight fashion. Alternatively, a conformal deposition process may be used as described below.

Figure 18:
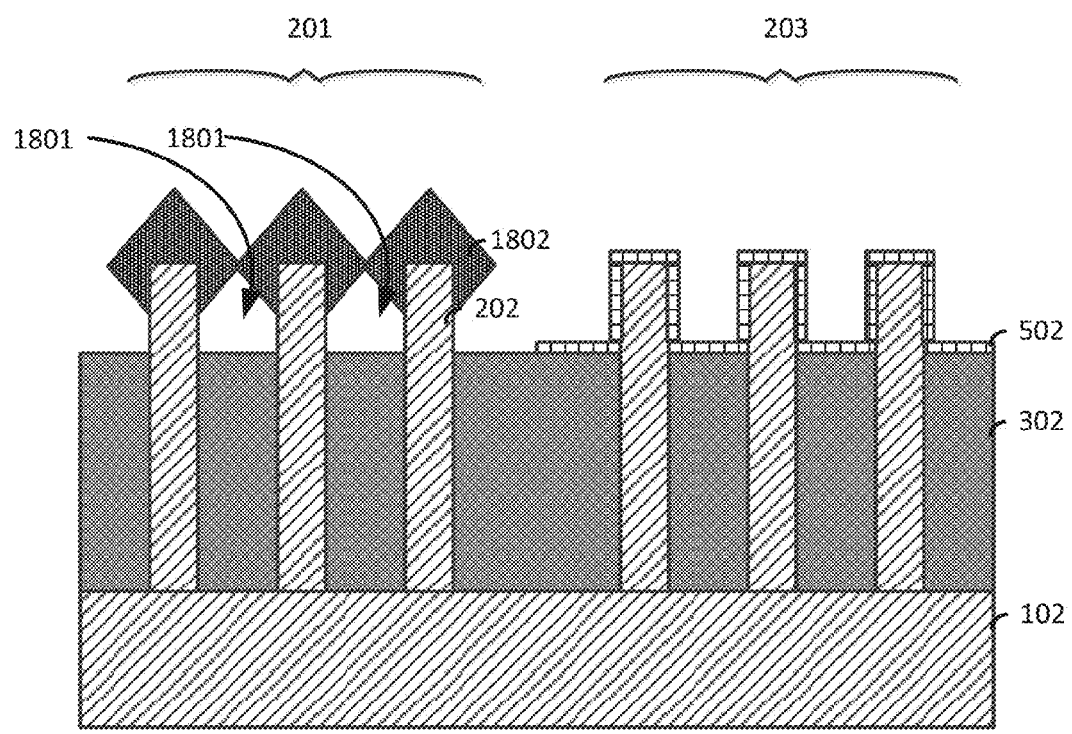
FIGS. 18-19 illustrate a cut-away view of an alternate exemplary method for forming a semiconductor device.
Figure 19:
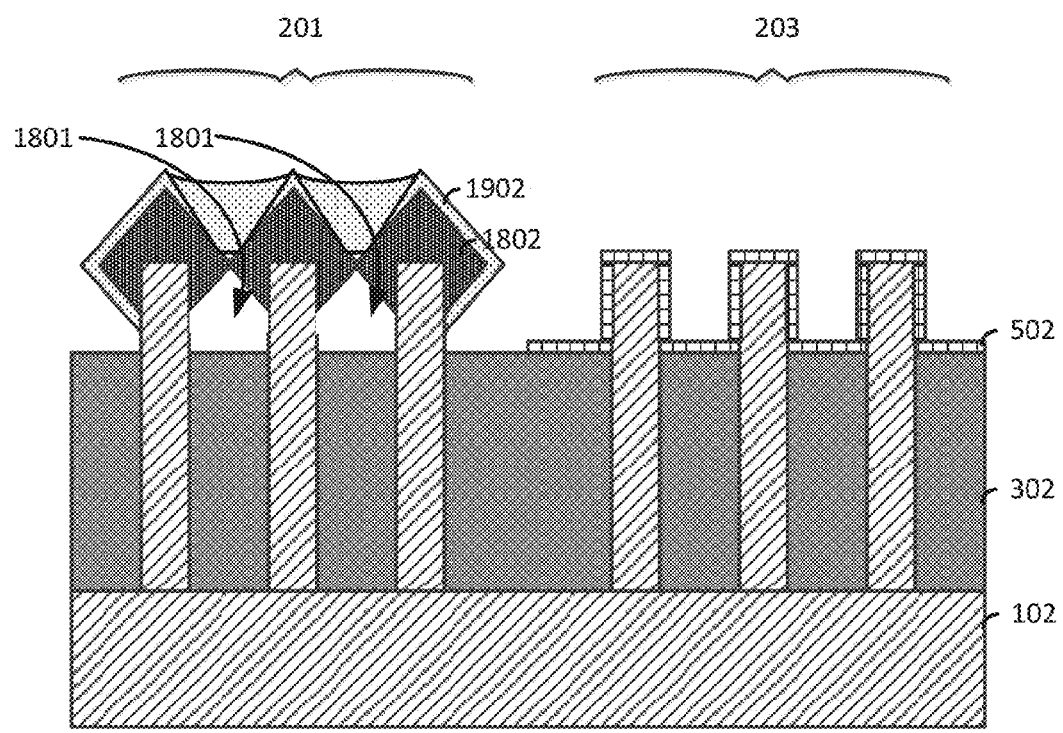

FIGS. 18-19 illustrate a cut-away view of an alternate exemplary method for forming a semiconductor device.

In this regard, FIG. 18 illustrates a cut-away view that is similar to FIG. 7 described above. However, the source/drain region 1802 of FIG. 18 is formed by an epitaxial growth process that results in a merging of the source/drain 1802 due to the growth of crystalline material on exposed portions of the fins 201. The resultant structure includes cavities (voids) 1801 that are defined by the STI region 302, the fins 201 and the source/drain region 1802.

FIG. 19 illustrates a cut-away view following the formation of a sacrificial cap layer 1902 on the source/drain region 1802 that is formed in a similar manner as the sacrificial cap layer 802 described above in FIG. 8.

Following the formation of the sacrificial cap layer 1902 in FIG. 19, the methods described above in FIGS. 9-17B can be performed to result in a finFET device having the source/drain region 1802.

FIGS. 20-23 illustrate another alternate exemplary method for forming a semiconductor device.

Figure 20:
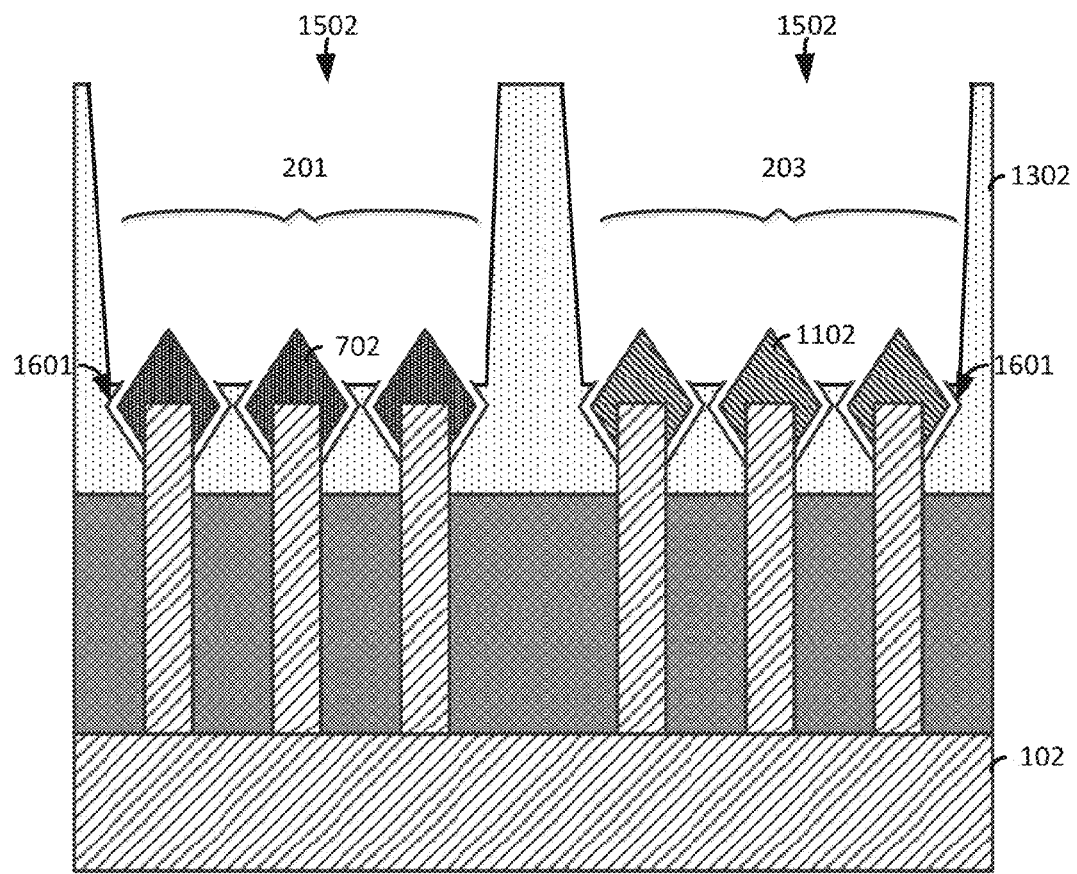
FIGS. 20-23 illustrate another exemplary method for fabricating a semiconductor device.

FIG. 20 illustrates a cut-away view of the resultant structure following the removal of the exposed sacrificial cap layers 1104 and 702 and formation of cavities 1602 as described above in FIG. 16.

Figure 21:
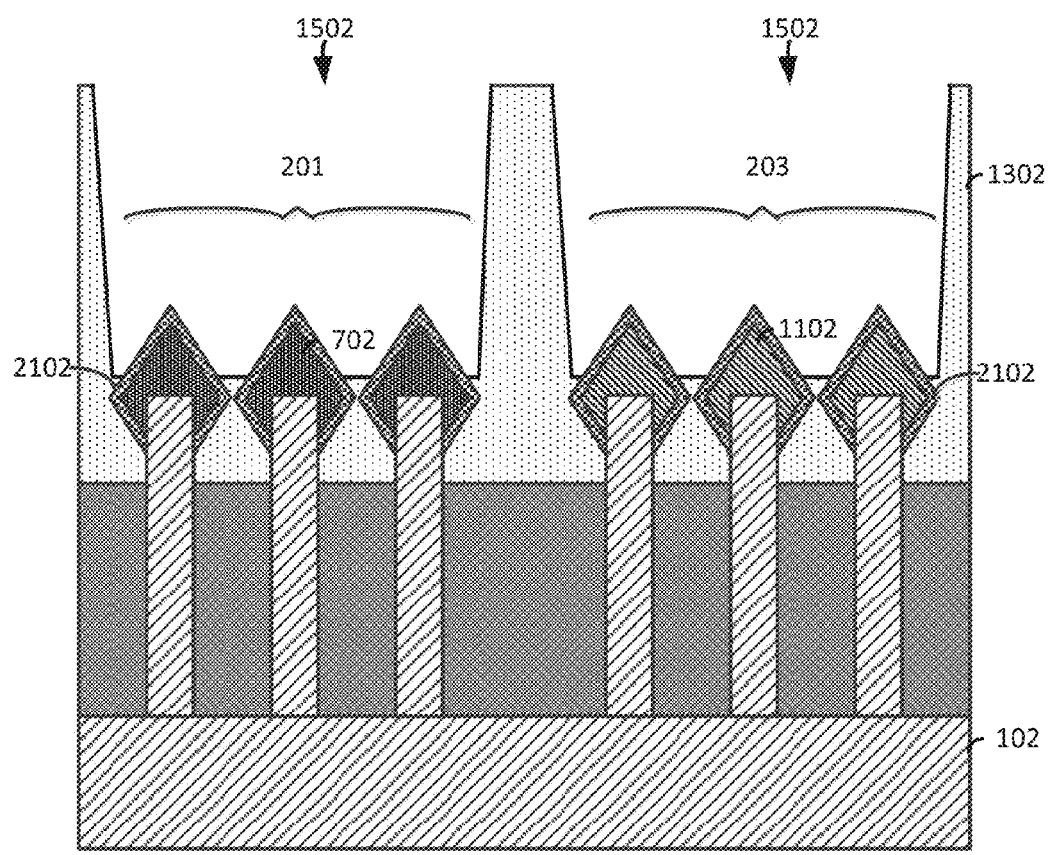

FIG. 21 illustrates a cut-away view following the deposition of a metallic material 2102 conformally over exposed portions of the source/drain regions 702 and 1102 and in the cavities 1602 (of FIG. 20). The metallic material 2102 may include any suitable conductive material such as, for example, Ti and is deposited using a conformal deposition process such as, for example, chemical vapor deposition.

Figure 22:
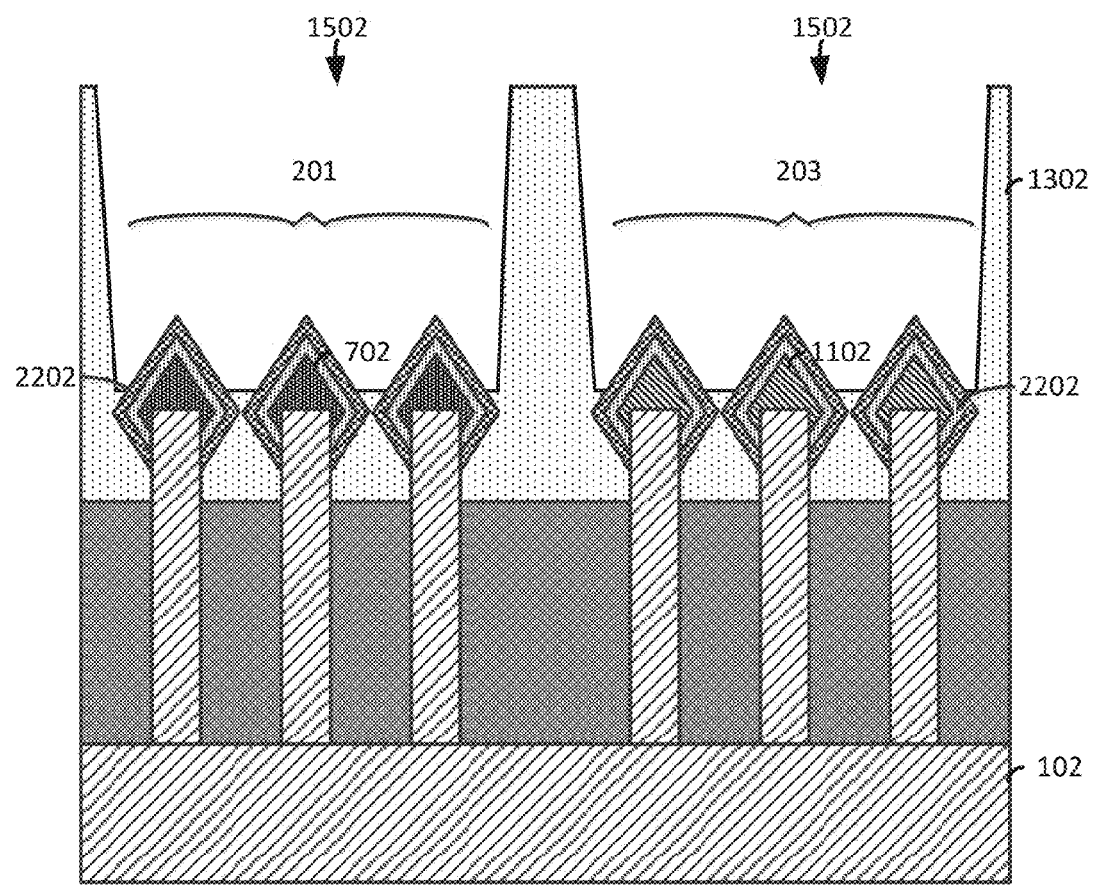

FIG. 22 illustrates a cut-away view following an annealing process that drives atoms of the metallic material 2102 into the source/drain regions 702 and forms silicide regions 2202 over the facets of the source/drain regions 702 and 1102.

Figure 23:
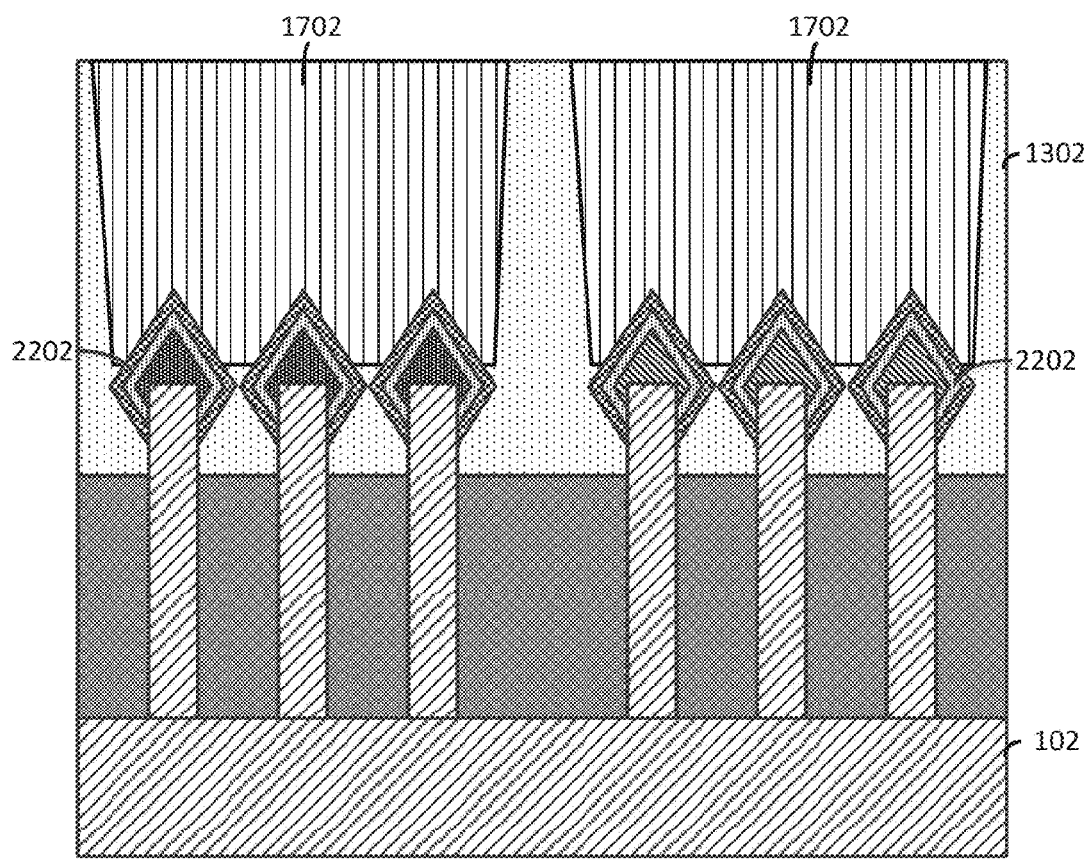

FIG. 23 illustrates a cut-away view following the formation of conductive contacts 1702 in the cavities 1502 (of FIG. 22) in a similar manner as described above.

Figure 24:
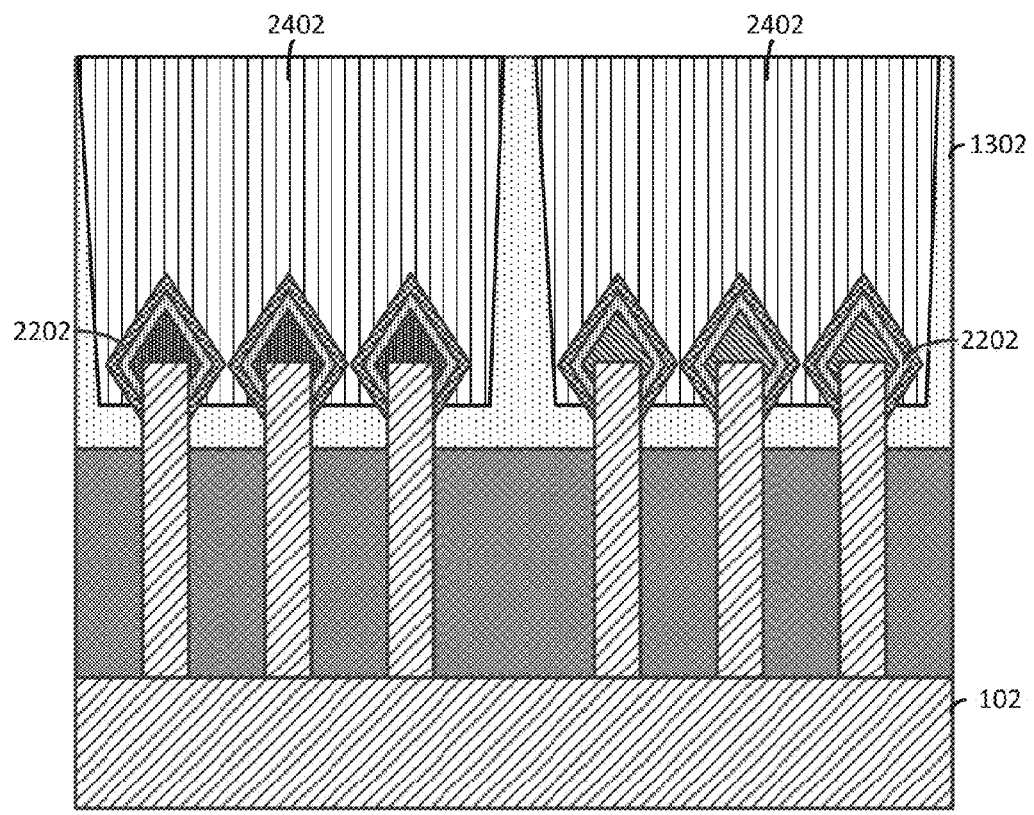
FIG. 24 illustrates a cut-away view of another alternate exemplary method for forming a semiconductor device.

FIG. 24 illustrates a cut-away view of another alternate exemplary method for forming a semiconductor device. In the illustrated example, the cavities 1502 (of FIG. 20) have been formed and expose a greater surface area of the silicide regions 2202 to increase the surface area of the interface between the silicide regions 2202 and the conductive contacts 2402.

The methods and resultant structures described herein provide for forming a source/drain region that has an undulating or non-planar surface with perturbations that increase the surface area of the source/drain region in the interface between the source/drain region and the conductive contacts to reduce external resistance in the contacts. The methods remove liner layers from the faceted surfaces of the source/drain regions without damaging the source/drain region prior to forming a silicide and conductive contacts on the source/drain regions.

As used herein, the terms "invention" or "present invention" are non-limiting terms and not intended to refer to any single aspect of the particular invention but encompass all possible aspects as described in the specification and the claims. The term "on" can refer to an element that is on, above or in contact with another element or feature described in the specification and/or illustrated in the figures.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" "on and in direct contact with" another element, there are no intervening elements present, and the element is in contact with another element.

It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
a first semiconductor fin and a second semiconductor fin;
a gate stack arranged over a channel region of the first semiconductor fin and the second semiconductor fin;
a source/drain region comprising a crystalline material having top faceted surfaces and bottom faceted surfaces, the bottom faceted surfaces contacting the first semiconductor fin and the second semiconductor fin, wherein the source/drain region comprises an undulating or non-planar surface;
an air gap formed conformally and in direct contact with the top faceted surfaces and the bottom faceted surfaces of the source/drain region; and
a conductive contact material in contact with the top faceted surfaces of the crystalline material.

2. The device of claim 1, wherein the top faceted surfaces of the crystalline material are not in direct contact with the first semiconductor fin or the second semiconductor fin.

3. A semiconductor device comprising:
semiconductor fins;
source/drain regions comprising a crystalline material having top faceted surfaces and bottom faceted surfaces, one of the source/drain regions contacting each of the semiconductor fins, wherein the source/drain region comprises an undulating or non-planar surface;
a dielectric material contacting adjacent semiconductor fins;
a silicide material on each of the source/drain regions, the silicide material comprising a first portion in direct contact with the top faceted surfaces and a second portion in direct contact with the bottom faceted surfaces of the source/drain regions, the silicide material formed in a conformal air gap in direct contact with the top faceted surfaces and the bottom faceted surfaces of the source/drain regions; and
a conductive contact material contacting the first portion and the second portion of the silicide material.

4. The device of claim 3, wherein the dielectric material contacts the silicide material on adjacent source/drain regions.

5. The device of claim 4, wherein the faceted surfaces of the crystalline material include faceted surfaces contacting each of the semiconductor fins.

6. The device of claim 5, wherein the silicide material is on the faceted surfaces contacting each of the semiconductor fins.

7. The device of claim 6, wherein the conductive contact material is on the faceted surfaces contacting each of the semiconductor fins.

8. The device of claim 5, wherein the faceted surfaces of the crystalline material include faceted surfaces not contacting the semiconductor fins.

9. The device of claim 8, wherein the conductive contact material is on the faceted surfaces not contacting the semiconductor fins.

10. The device of claim 3, wherein the faceted surfaces of the crystalline material include faceted surfaces contacting each of the semiconductor fins.

11. The device of claim 10, wherein the conductive contact material is on the faceted surfaces contacting each of the semiconductor fins.

12. The device of claim 10, wherein the faceted surfaces of the crystalline material include faceted surfaces not contacting the semiconductor fins.

13. The device of claim 12, wherein the conductive contact material is on the faceted surfaces not contacting the semiconductor fins.

14. The device of claim 12, wherein the silicide material is only on the faceted surfaces not contacting the semiconductor fins.

15. A semiconductor device comprising:
semiconductor fins;
source/drain regions comprising a crystalline material having top faceted surfaces and bottom faceted surfaces, one of the source/drain regions contacting each of the semiconductor fins; and
an air gap formed conformally and in direct contact with the top faceted surfaces and the bottom faceted surfaces of the source/drain regions;
wherein the source/drain regions comprise an undulating or non-planar surface; and
wherein adjacent source/drain regions contact each other.

16. The device of claim 15 further comprising insulating material between adjacent semiconductor fins.

17. The device of claim 16, wherein the adjacent semiconductor fins, the source/drain regions contacting the adjacent semiconductor fins, and the insulating material between the adjacent semiconductor fins define a cavity between the adjacent semiconductor fins.

18. The device of claim 17, wherein the crystalline material is formed by an epitaxial growth process.

* * * * *